(12) United States Patent
Iwai (10) Patent No.: US 11,239,582 B2
(45) Date of Patent: Feb. 1, 2022

(54) ELECTRICAL APPARATUS HAVING ENTRAPPING STRUCTURE

(71) Applicant: Tyco Electronics Japan G.K., Kawasaki (JP)

(72) Inventor: Daijiro Iwai, Kawasaki (JP)

(73) Assignee: Tyco Electronics Japan G.K., Kawasaki (JP)

( * ) Notice: Subject to any disclaimer, the term of this patent is extended or adjusted under 35 U.S.C. 154(b) by 0 days.

(21) Appl. No.: 16/682,368

(22) Filed: Nov. 13, 2019

(65) Prior Publication Data
US 2020/0153129 A1   May 14, 2020

(30) Foreign Application Priority Data

Nov. 13, 2018  (JP) .............................. JP2018-212935

(51) Int. Cl.
| | | |
|---|---|---|
| H01R 12/58 | (2011.01) | |
| H01R 13/426 | (2006.01) | |
| H01R 13/436 | (2006.01) | |
| H01R 13/648 | (2006.01) | |
| H01R 13/74 | (2006.01) | |
| H05K 3/30 | (2006.01) | |

(52) U.S. Cl.
CPC ........... *H01R 12/58* (2013.01); *H01R 13/426* (2013.01); *H01R 13/4362* (2013.01); *H01R 13/648* (2013.01); *H01R 13/74* (2013.01); *H05K 3/308* (2013.01); *H05K 2201/10189* (2013.01); *H05K 2201/10878* (2013.01)

(58) Field of Classification Search
CPC ...... H01R 43/20; H01R 13/74; H01R 13/516; H01R 12/58; H01R 13/426; H01R 13/4362; H01R 13/648; H05K 3/308; H05K 2201/10878; H05K 2201/10189

USPC ....... 439/607.4, 607.35, 731, 906, 465, 76.1
See application file for complete search history.

(56) References Cited

U.S. PATENT DOCUMENTS

| | | | | |
|---|---|---|---|---|
| 4,938,704 A | * | 7/1990 | Fujiura | .............. H01R 13/6594 439/95 |
| 5,603,639 A | * | 2/1997 | Lai | ..................... H01R 12/7047 439/607.31 |
| 5,752,854 A | | 5/1998 | Capp | |
| 5,885,107 A | * | 3/1999 | Sluss | .................. H01R 13/4223 439/595 |
| 6,565,366 B1 | * | 5/2003 | Wu | ..................... H01R 13/627 439/607.13 |
| 6,659,796 B1 | * | 12/2003 | Waddell | .............. H01R 13/745 439/352 |

(Continued)

FOREIGN PATENT DOCUMENTS

| | | |
|---|---|---|
| JP | H03163768 A | 7/1991 |
| JP | 2005-285662 A | 10/2005 |

OTHER PUBLICATIONS

Extended European Search Report, dated Apr. 2, 2020, 5 pages.
Abstract of JPH03163768A, dated Jul. 15, 1991, 1 page.

*Primary Examiner* — Marcus E Harcum
(74) *Attorney, Agent, or Firm* — Barley Snyder (57) ABSTRACT

An electrical apparatus includes an electrical connector having a plurality of terminals and a connector housing retaining the terminals, a case containing the electrical connector, a circuit board electrically connected with the terminals, and an entrapping structure corresponding to at least a portion of a gap between the connector housing and the case. The entrapping structure has a dead end with an opening facing the gap.

20 Claims, 5 Drawing Sheets

(56) References Cited

U.S. PATENT DOCUMENTS

| | | | | |
|---|---|---|---|---|
| 6,887,108 B2* | 5/2005 | Wu | H01R 13/516 | 439/638 |
| 7,044,782 B2* | 5/2006 | Enami | H01R 13/648 | 439/564 |
| 7,074,084 B2* | 7/2006 | Shuey | H01R 13/6315 | 439/607.32 |
| 7,309,246 B1* | 12/2007 | Walter | H01R 13/6485 | 439/181 |
| 7,479,036 B2* | 1/2009 | Briant | H01R 13/658 | 439/607.17 |
| 7,485,013 B2* | 2/2009 | Kuo | H01R 9/03 | 439/731 |
| 7,699,622 B2* | 4/2010 | Sakamoto | H01R 12/716 | 439/76.1 |
| 7,867,040 B2* | 1/2011 | Yu | H01R 13/518 | 439/701 |
| 7,869,218 B2* | 1/2011 | Ni | H05K 5/0269 | 361/737 |
| 8,738,097 B2* | 5/2014 | Hong | H04M 1/0274 | 455/575.1 |
| 8,790,138 B2* | 7/2014 | Wang | H01R 27/02 | 439/660 |
| 8,939,777 B2* | 1/2015 | Lin | H01R 43/16 | 439/79 |
| 8,942,001 B2* | 1/2015 | Kawai | H05K 5/0069 | 361/752 |
| 2005/0287841 A1* | 12/2005 | Kitamura | H05K 5/0039 | 439/76.1 |
| 2006/0030173 A1* | 2/2006 | Kawakita | H01R 12/716 | 439/76.1 |
| 2007/0093126 A1* | 4/2007 | Tsuo | H01R 13/748 | 439/563 |
| 2007/0264851 A1* | 11/2007 | Honda | H01R 12/57 | 439/157 |
| 2011/0086546 A1* | 4/2011 | Mao | H01R 13/6594 | 439/607.4 |
| 2013/0178100 A1* | 7/2013 | Nagata | H01R 13/648 | 439/607.35 |
| 2015/0295342 A1* | 10/2015 | Komiyama | H01R 13/502 | 439/626 |
| 2017/0302031 A1 | 10/2017 | Cheng | | |
| 2018/0213658 A1* | 7/2018 | Nuriya | H05K 7/20445 | |

* cited by examiner

ELECTRICAL APPARATUS HAVING ENTRAPPING STRUCTURE

CROSS-REFERENCE TO RELATED APPLICATION

This application claims the benefit of the filing date under 35 U.S.C. § 119(a)-(d) of Japanese Patent Application No. 2018-212935, filed on Nov. 13, 2018.

FIELD OF THE INVENTION

The present invention relates to an electrical connector and, more particularly, to an electrical apparatus including the electrical connector and a case holding the electrical connector.

BACKGROUND

Under International Electrotechnical Commission (IEC) standards, protection against the ingress of water, body parts, and solid objects into electrical apparatuses (Ingress Protection) is defined. As an example, "a wire having a diameter of 1 mm is not accessible to a hazardous part" is defined. This definition is also applicable to electrical connectors.

Between a connector housing of an electrical connector and a case containing the electrical connector, a gap inevitably occurs, as shown for example in FIGS. 5 and 6 of Japanese Patent No. H03-163768A. This is due to dimensional tolerance of the connector housing of the electrical connector and the case. Accordingly, between the connector housing and the case, a gap occurs through which the wire may intrude. In an electrical connector mounted on a circuit board to which high voltage is applied, the layout of the circuit board is so determined as to prevent the wire from reaching the range of a hazardous part to which high voltage is applied. That is, the layout is adopted that only allows the wire intruding from the gap to reach a part other than the hazardous part.

SUMMARY

An electrical apparatus includes an electrical connector having a plurality of terminals and a connector housing retaining the terminals, a case containing the electrical connector, a circuit board electrically connected with the terminals, and an entrapping structure corresponding to at least a portion of a gap between the connector housing and the case. The entrapping structure has a dead end with an opening facing the gap.

BRIEF DESCRIPTION OF THE DRAWINGS

The invention will now be described by way of example with reference to the accompanying Figures, of which.

DETAILED DESCRIPTION OF THE EMBODIMENT(S)

Embodiments of the present invention will be described hereinafter in detail with reference to the attached drawings, wherein like reference numerals refer to like elements. The present invention may, however, be embodied in many different forms and should not be construed as being limited to the embodiments set forth herein; rather, these embodiments are provided so that the disclosure will convey the concept of the invention to those skilled in the art.

An electrical apparatus 1 according to an embodiment is shown in FIGS. 3A-4C. The electrical apparatus 1 comprises an electrical connector 10, a case 50 containing the electrical connector 10, and a circuit board 60 mounted with the electrical connector 10. The electrical apparatus 1 has the electrical connector 10 with a first dead end 26, shown in FIGS. 5A-5D, for guiding a wire W intruding, thereby preventing the wire W from reaching the circuit board 60.

In the electrical apparatus 1, a side of the electrical connector 10 on which the circuit board 60 is disposed is defined as a lower side, and an opposite side is defined as an upper side. A side on which the electrical connector 10 and a mating connector (not shown) are mated is defined as a front F, and a side on which a terminal 30 is drawn is defined as a rear R. Front F and rear R may be used as a relative positional relation. In addition, the x-axis direction, the y-axis direction, and the z-axis direction shown in FIG. 1 are defined as the longitudinal direction X, the width direction Y, and the height direction Z, respectively.

Figure 1:
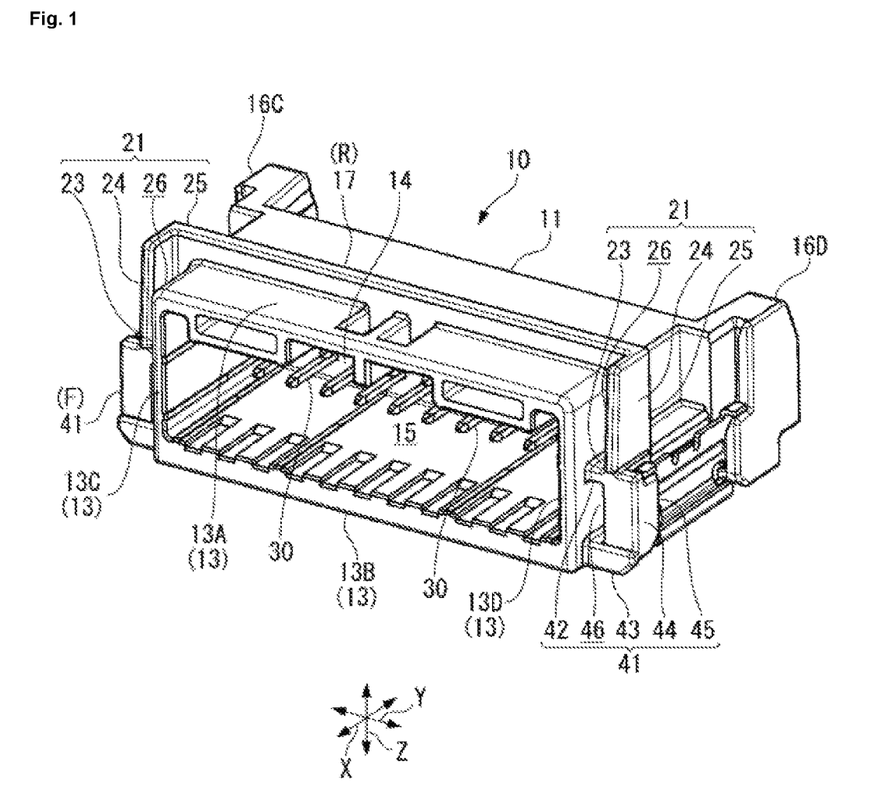
FIG. 1 is a perspective view of an electrical connector according to an embodiment.
Figure 2A:
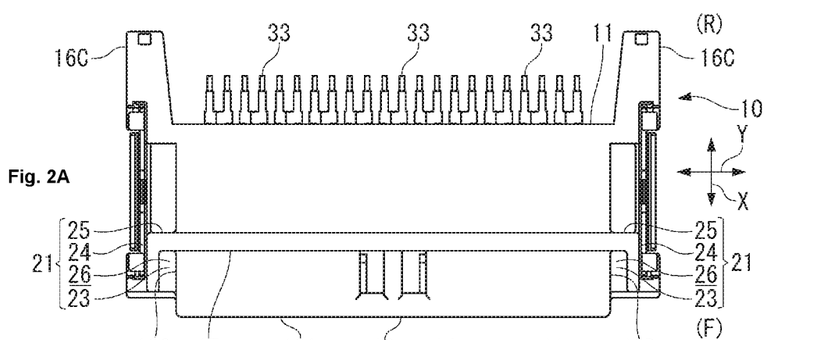
FIG. 2A is a top view of the electrical connector.
Figure 2B:
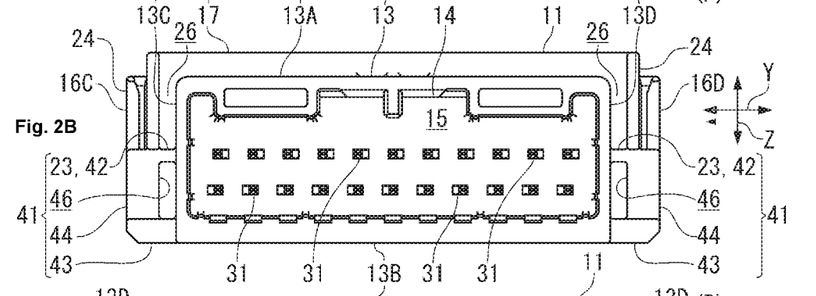
FIG. 2B is a front view of the electrical connector.
Figures 2C, 2D:
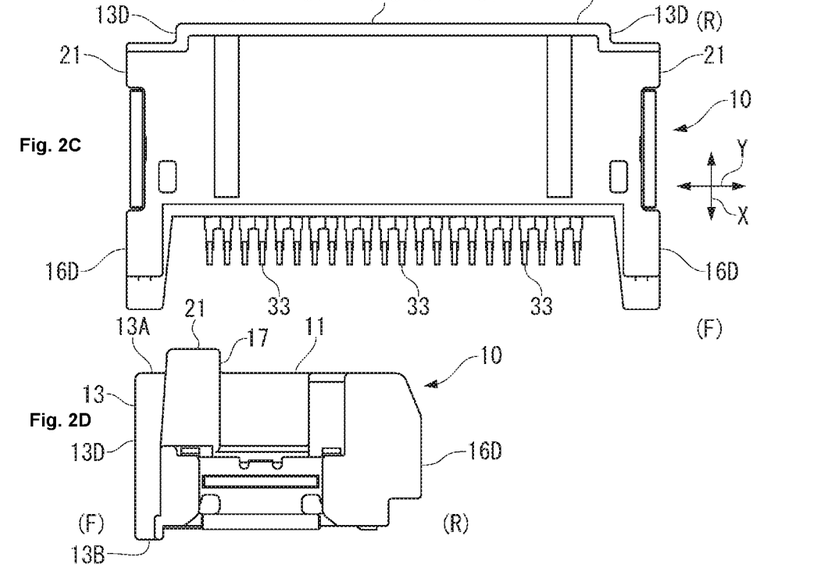
FIG. 2C is a bottom view of the electrical connector.
FIG. 2D is a side view of the electrical connector.

The electrical connector 10, as shown in FIGS. 1-2D, includes a connector housing 11, mated with a connector housing of the mating connector (not shown), and a plurality of terminals 30 retained in the connector housing 11. The connector housing 11 has, at a front side, a mating sleeve 13 into which the mating connector (not shown) is mated, as shown in FIGS. 1, 2A, and 2B. The mating sleeve 13 has a receiving space 15 formed therein, and the mating connector is inserted into the receiving space 15, and thereby mated with the connector housing 11. The connector housing 11 is integrally formed by injection molding of a resin material.

The mating sleeve 13, as shown in FIGS. 1-2D, has an upper wall 13A (also referred to as a first upper wall), a lower wall 13B (also referred to as a first lower wall) positioned at a predetermined distance from the upper wall 13A, a front side wall 13C (also referred to as a first side wall) connecting first ends of the upper wall 13A and the lower wall 13B in the width direction Y, and a front side wall 13D (also referred to as a first side wall) connecting second ends of the upper wall 13A and the lower wall 13B in the width direction Y. A terminal retaining wall 14 is provided at the rear end R of the mating sleeve 13, and a space enclosed with the upper wall 13A, the lower wall 13B, the front side wall 13C, the front side wall 13D and the terminal retaining wall 14 constitutes the receiving space 15.

Behind the terminal retaining wall 14, a rear side wall 16C and a rear side wall 16D are provided at a predetermined distance in the width direction Y, as shown in FIGS. 1-2D. The distance between the rear side wall 16C and the rear side wall 16D is set to be wider than the distance between the front side wall 13C and the front side wall 13D, and a board connecting portion 33 of the terminal 30 is led out in a region between the rear side wall 16C and the rear side wall 16D.

The mating sleeve 13 has a flange 17, shown in FIGS. 1-2D. The flange 17 extends from near the center in the height direction Z of the front side wall 13C toward near the center in the height direction Z of the front side wall 13D through the upper wall 13A. The flange 17 at the upper wall 13A has a plate-like shape protruding upward in the height direction Z. The flange 17 at the front side wall 13C and the front side wall 13D protrudes by a predetermined amount in the width direction Y and protrudes frontward (F) from its distal end, and the shape as viewed from above is a C-like shape. The flange 17 prevents a wire W intruding from a gap between the upper wall 13A of the mating sleeve 13 and the case 50 from reaching the circuit board 60.

As shown in FIGS. 1-2D, the mating sleeve 13 has a first entrapping structure 21 provided on each of outer peripheral faces of the front side wall 13C and the front side wall 13D. The first entrapping structure 21 is provided for the purpose of being hit by the wire W that can intrude from the gap between the mating sleeve 13 and the case 50, preventing the wire W from reaching the circuit board 60.

The first entrapping structure 21, as shown in FIGS. 1-2D, has a lower wall 23 (also referred to as a second lower wall) protruding outward in the width direction from each of the front side wall 13C and the front side wall 13D, a side wall 24 (also referred to as a second side wall) extending from an outer end in the width direction Y of the lower wall 23, and a rear wall 25 connecting rear ends of the lower wall 23 and the side wall 24, as shown in FIG. 1 and FIG. 2B. The side wall 24 and the rear wall 25 are provided as portions of the flange 17 described above.

A space enclosed with the lower wall 23, the side wall 24, the rear wall 25 and the front side wall 13C or the front side wall 13D forms the first dead end 26, shown in FIGS. 1-2D. A front end of the front side wall 13C or the front side wall 13D is protruded more frontward (F) than front ends of the lower wall 23, the side wall 24 and the rear wall 25. The first dead end 26 has an opening so provided as to correspond to a gap C1 described in greater detail below with reference to FIGS. 4A-5D. A dimension L1 in the width direction Y of the first dead end 26 is larger than the gap C1.

The mating sleeve 13, as shown in FIGS. 1-2D, has a second entrapping structure 41 below the first entrapping structure 21. The second entrapping structure 41 has a same purpose as the first entrapping structure 21. The second entrapping structure 41 has basically the same structure as the first entrapping structure 21, with an upper wall 42 protruding outward in the width direction from each of the front side wall 13C and the front side wall 13D, and a lower wall 43 provided at a predetermined distance in the height direction Z from the upper wall 42, as shown in FIG. 1. The second entrapping structure 41 has a side wall 44 connecting outer ends in the width direction Y of the upper wall 42 and the lower wall 43, and a rear wall 45 connecting rear ends of the upper wall 42, the lower wall 43 and the side wall 44. A space enclosed with the upper wall 42, the lower wall 43, the side wall 44, the rear wall 45 and the front side wall 13C or the front side wall 13D forms a second dead end 46.

Figure 4A:
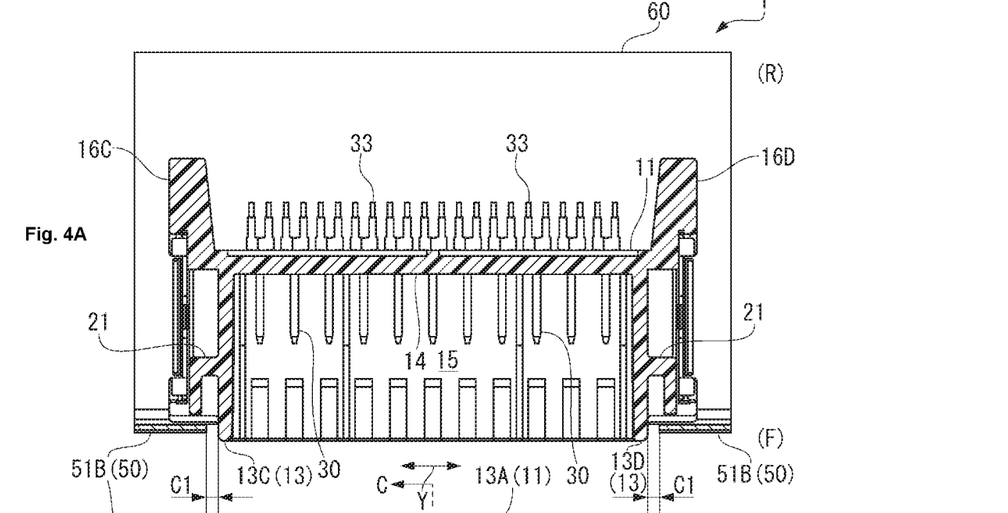
FIG. 4A is a sectional top view of the electrical apparatus, taken along line A-A of FIG. 4B.
Figure 4B:
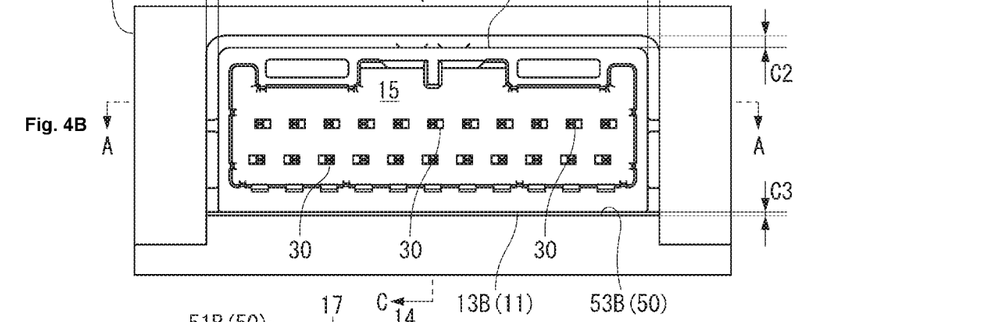
FIG. 4B is a front view of the electrical apparatus.
Figure 4C:
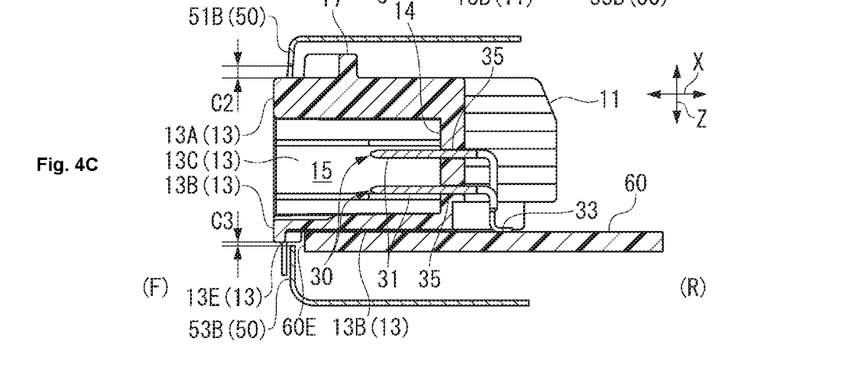
FIG. 4C is a sectional side view of the electrical apparatus, taken along line C-C of FIG. 4C.

The terminal 30, as shown in FIGS. 1-2D, has a mating connecting portion 31 for connection with a terminal of the mating connector, and a board connecting portion 33 for electrical connection with the circuit board 60, as shown in FIG. 4C. The terminal 30 connects the mating connecting portion 31 and the board connecting portion 33, and is provided with a retained portion 35 press-fitted in the terminal retaining wall 14 of the connector housing 11. In the terminal 30, the mating connecting portion 31 and the retained portion 35 extend substantially parallel to a direction of mating with the mating connector (longitudinal direction X) and, in addition, the board connecting portion 33 descends toward the circuit board 60. The terminal 30 is formed by stamping a highly-conductive metal sheet made of, for example, a copper alloy, and simultaneously bending to a predetermined position.

A plurality of terminals 30 are press-fitted into the terminal retaining wall 14, as shown in FIGS. 1-2D, and thereby retained in the connector housing 11. In this state, the board connecting portion 33 is joined by soldering to a required part of the circuit board 60.

The case 50 is made of metal and, as shown in FIGS. 3A-4C, includes an upper case 51 and a lower case 53 containing the electrical connector 10 and the circuit board 60 mounted with the electrical connector 10. It should be noted that only a part of the case 50 that covers the connector 10 is shown, and the other parts of the case 50 are not shown.

Figure 3A:
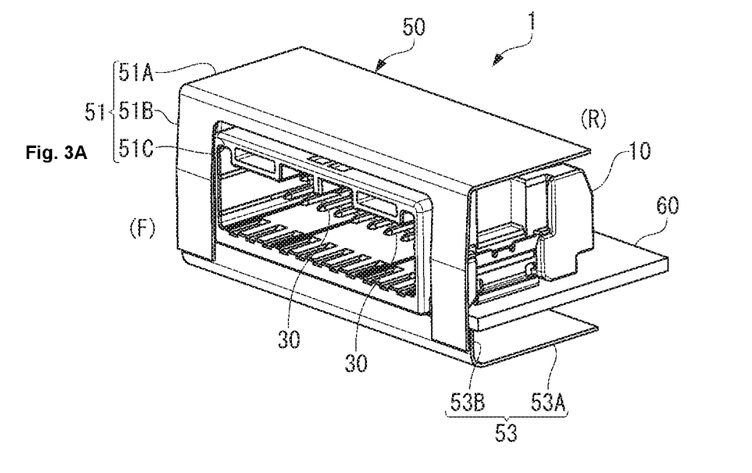
FIG. 3A is a perspective view of an electrical apparatus according to an embodiment.
Figure 3B:
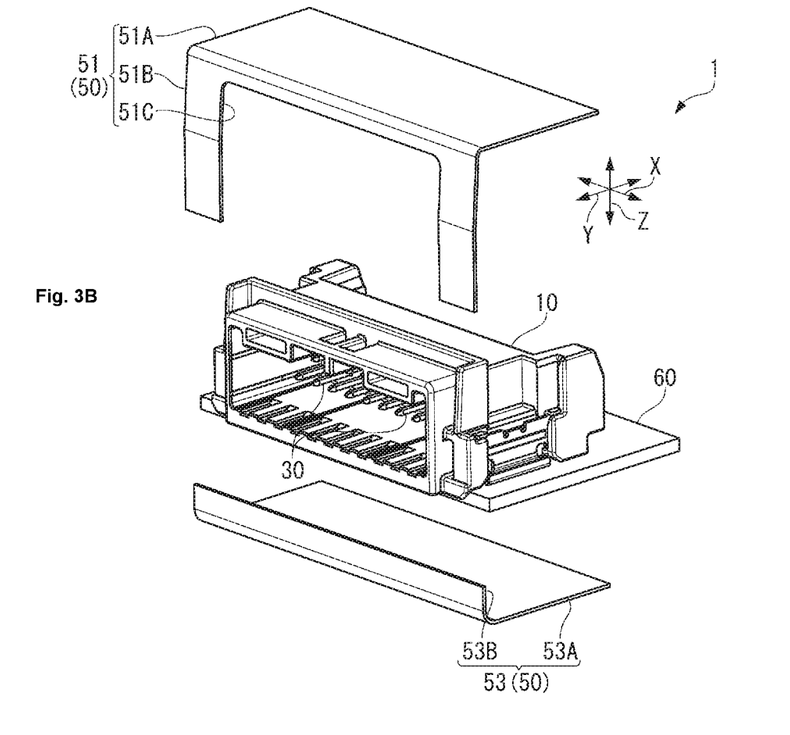
FIG. 3B is an exploded perspective view of the electrical apparatus.

As shown in FIGS. 3A and 3B, the upper case 51 has an upper wall 51A covering the electrical connector 10 from the top and a front wall 51B covering the electrical connector 10 from the front (F). In the front wall 51B, an opening 51C is provided that is necessary for allowing passage of the mating connector to be mated with the electrical connector 10. The lower case 53 has a lower wall 53A covering the electrical connector 10 from the bottom, and a front wall 53B covering the electrical connector 10 from the front (F). The front wall 53B is located outside the lower wall 13B of the connector housing 11 so as not to interfere with the mating connector from coming through, with the electrical connector 10.

The case 50 has the upper case 51 and the lower case 53 assembled together such that they have a predetermined positional relation with the electrical connector 10, as shown in FIG. 3A. In this regard, because of a dimensional tolerance between the connector housing 11 of the electrical connector 10 and the case 50, it is very difficult to prevent a gap between the connector housing 11 and the case 50.

Figure 5A:
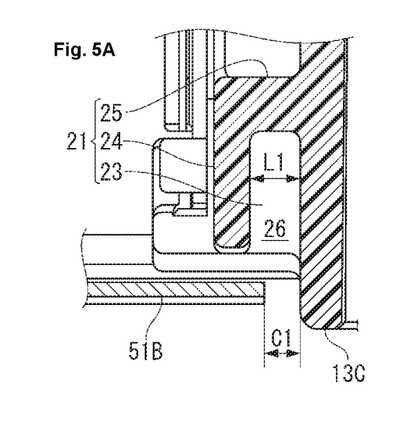
FIG. 5A is an enlarged view of a portion of the electrical apparatus in FIG. 4A.

The gap that occurs when the connector housing 11 and the case 50 are assembled together will be described with reference to FIGS. 4A-4C. FIGS. 4A, 4B, and 5A illustrate a gap between the connector housing 11 and the case 50 in the width direction Y. The gap C1 occurs between the front side wall 13C of the connector housing 11 and the case 50, as shown in FIGS. 4A and 4B. The same would exist between the front side wall 13D and the front wall 51B. FIGS. 4B and 4C illustrate gaps C2, C3 in the height direction Z. The gap C2 occurs between the upper wall 13A of the connector housing 11 and the front wall 51B of the case 50. In addition, the gap C3 occurs between the lower wall 13B of the connector housing 11 and the front wall 53B of the case 50.

All the gaps C1-C3 can be an entrance allowing for the intrusion of the wire W. It is necessary to prevent the wires W intruding from these entrances from reaching a hazardous region of the circuit board 60. Of the gaps C1-C3, the wires W intruding from the gaps C2 and C3 cannot reach the circuit board 60 for the reasons detailed below.

If the wire W intrudes from the gap C2 between the upper wall 13A and the front wall 51B, shown in FIG. 4C, the wire W hits against the flange 17 of the connector housing 11, and thus the wire W is unlikely to intrude further. Even if the wire W intrudes over the flange 17, because of the presence of the connector housing 11 between the wire W and the circuit board 60, the connector housing 11 becomes an obstacle so that the wire W cannot reach the circuit board 60.

If the wire W intrudes from the gap C3 between the lower wall 13B and the front wall 53B, as shown in FIG. 4C, a front end of the lower wall 13B in the connector housing 11 has a ridge 13E protruding downward, and accordingly, the wire W intrudes upward. Therefore, even if the wire W intrudes over the ridge 13E, the wire W hits against the lower wall 13B. Even if the wire W intrudes further rearwards (R), the wire W hits against a front edge 60E of the circuit board 60. Behind (R) the front edge 60E is the electrical connector 10 mounted on the circuit board 60, and thus there is no space for the wire W to come in between the circuit board 60 and the electrical connector 10.

Unlike the gaps C2 and C3, the gap C1 can be an entrance for intrusion of the wire W and the wire W intruding therefrom may reach the circuit board 60. For this reason, the electrical connector 10 of the present embodiment is provided with the entrapping structure 21 for preventing the wire W from reaching the circuit board 60. Hereinbelow, the function and effect achieved by the first entrapping structure 21 will be described with reference to FIGS. 5A-5D. Though the description is omitted, the second entrapping structure 41 achieves the same effect.

Figure 5B:
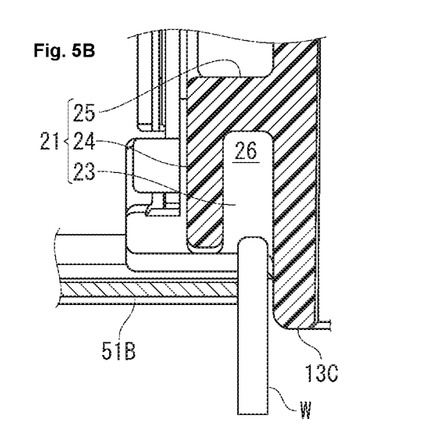
FIG. 5B is an enlarged sectional top view of the electrical apparatus with a wire intruding in a longitudinal direction.

As shown in FIG. 5B, if the wire W intrudes parallel to the longitudinal direction X into the gap C1 and continues intruding, the wire W advances through the first dead end 26 and hits against the rear wall 25.

Figure 5C:
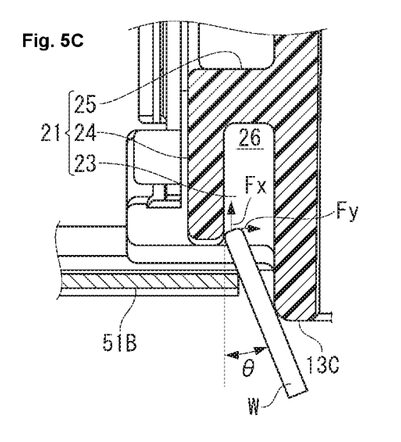
FIG. 5C is an enlarged sectional top view of the electrical apparatus with a wire intruding at an angle with respect to the longitudinal direction.

Next, as shown in FIG. 5C, if the wire W intrudes at an angle to the longitudinal direction X into the gap C1, the tip of the wire W hits against the inside of a distal end of the side wall 24. An angle of inclination θ is an acute angle to the longitudinal direction X, and thus a load applied to a tip portion of the wire W has a component Fx in the longitudinal direction X larger than a component Fy in the width direction Y. Therefore, if the wire W continues to be pushed in, the wire W advances through the first dead end 26.

Though omitted in the figure, if the wire W intrudes into the gap C1 at a reverse angle from what is shown in FIG. 5C, the wire W comes into contact with an outer face of the front side wall 13C, advances deep into the first dead end 26 while being guided by the outer face of the front side wall 13C, and hits the rear wall 25.

Because the electrical connector 10 has the entrapping structure 21, even if the wire W intrudes, the wire W can be prevented from reaching the circuit board 60. Therefore, even when the electrical apparatus 1 is provided with the circuit board 60 to which high voltage is applied, it is unnecessary to put a limitation on a region where a hazardous part to which high voltage is applied is positioned, or the limitation, if any, can be narrowed. Therefore, according to the electrical apparatus 1 of the present embodiment, the degree of freedom of a layout can be increased, including a position in which the electrical position 10 is mounted, and the number of electrical connectors 10 mounted, in addition to the region where the hazardous part is positioned.

Figure 5D:
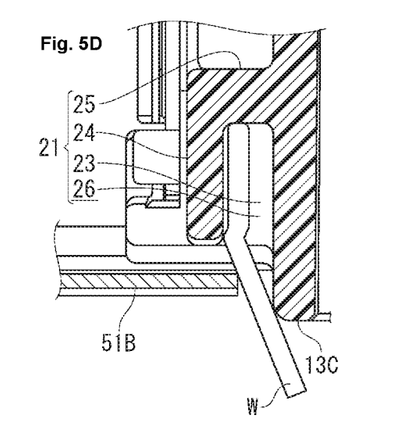
FIG. 5D is an enlarged sectional top view of the electrical apparatus with a wire fully intruded at the angle with respect to the longitudinal direction.

As shown in FIG. 5A, the dimension L1 in the width direction Y of the first dead end 26 is larger than the gap C1. Therefore, as shown in FIG. 5B, if the wire W intrudes parallel to the longitudinal direction X, the wire W is inevitably entrapped into the first dead end 26. In addition, as shown in FIGS. 5C and 5D, even if the wire W intrudes at an angle to the longitudinal direction X, the wire W hits against the inside of the distal end of the side wall 24 at the acute angle θ, and thus the wire W is entrapped into the first dead end 26 without difficulty.

The first dead end 26 has the front side wall 13C or the front side wall 13D that is an outer wall of the connector housing 11, the lower wall 23, the side wall 24, and the rear wall 25. That is, the first dead end 26, excluding the opening, is closed to the outside in the longitudinal direction X, the width direction Y and the height direction Z. This enables the first dead end 26 not only to prevent the wire W intruding from reaching the circuit board 60, but also to prevent the wire W intruding from reaching a region other than the circuit board 60.

The connector housing 11 has the upper wall 13A and the lower wall 13B each positioned parallel to the circuit board 60 and at a predetermined distance, and the pair of side walls 13C, 13D connecting the upper wall 13A and the lower wall 13B. As described above, regarding the gaps C2 and C3, it is not possible that the wire W reaches the circuit board 60. For this reason, the entrapping structure 21 in the present embodiment is provided only for the gap C1 between the front side walls 13C, 13D and the case 50 through which the wire W may reach the circuit board 60.

On the other hand, the entrapping structure 21 is not provided for parts corresponding to the gaps C2 and C3 for the reasons described above, but this is not an element that limits the present invention. That is, an entrapping structure of the present invention may be provided for any gap between the connector housing 11 and the case 50 through which the wire W may reach the circuit board 60.

The entrapping structure in the present invention is not limited to the forms of the first entrapping structure 21 and the second entrapping structure 41 shown in the embodiment. That is, the first entrapping structure 21 and the second entrapping structure 41 may have any form as long as they have the first dead end 26 and the second dead end 46, respectively, for entrapping a wire intruding from a gap. For example, the side walls 23, 44 shown above have a rectangular vertical section, but a face opposite the connector housing 11 may be an inclined face tapering frontward.

In addition, the second entrapping structure 41 according to the present embodiment is provided with the upper wall 42. However, considering only preventing the wire W from reaching the circuit board 60, the second entrapping structure 41 does not necessarily have to be provided with the upper wall 42. That is, it would suffice if a dead end of the present invention is provided for a path through which a wire can reach the circuit board, as in the first entrapping structure 21.

What is claimed is:

1. An electrical apparatus, comprising:
    an electrical connector having a plurality of terminals and a connector housing retaining the terminals, the connector housing including a mating sleeve with a first upper wall and a first lower wall disposed at a predetermined distance in a height direction of the connector housing, and a pair of first side walls, the first upper wall and the first lower wall are connected only by the pair of first side walls;
    a case containing the electrical connector;
    a circuit board electrically connected with the terminals and arranged parallel to the first upper wall and the first lower wall; and an entrapping structure corresponding to at least a portion of a gap between the connector housing and the case, the entrapping structure including:
- a second lower wall protruding outward in a width direction of the connector housing from one of the first side walls;
- a second side wall extending from an outer end of the second lower wall in a vertical direction;
- a rear wall connecting a rear end of the second lower wall and a rear end of the second side wall; and
- a dead end with an opening facing the gap.

2. The electrical apparatus of claim 1, wherein the gap is disposed between one of the first side walls and the case.

3. The electrical apparatus of claim 1, wherein the opening of the dead end has a width larger than a width of the gap.

4. An electrical apparatus, comprising:
- an electrical connector having a plurality of terminals and a connector housing retaining the terminals;
- a case containing the electrical connector; and
- a first entrapping structure corresponding to at least a portion of a gap between the connector housing and the case, the first entrapping structure has a first dead end with an opening facing the gap,
- wherein the connector housing has a mating sleeve comprising a second entrapping structure disposed below the first entrapping structure.

5. The electrical apparatus of claim 4, wherein the mating sleeve further comprises a first upper wall and a first lower wall disposed at a predetermined distance from each other, and a pair of first side walls connecting the first upper wall and the first lower wall.

6. The electrical apparatus of claim 5, wherein the mating sleeve has a flange extending from one of the first side walls through the first upper wall.

7. The electrical apparatus of claim 6, wherein the first entrapping structure has a second lower wall protruding outward in a width direction from the one of the first side walls, a second side wall extending in a vertical direction from the second lower wall, and a rear wall connecting the second lower wall and the second side wall.

8. The electrical apparatus of claim 7, wherein the first dead end is defined between the second lower wall, the second side wall, the rear wall, and the one of the first side walls.

9. The electrical apparatus of claim 8, wherein the opening of the dead end has a width larger than a width of the gap.

10. The electrical apparatus of claim 8, wherein the second entrapping structure corresponds to at least a portion of a gap between the connector housing and the case, the second entrapping structure has a second dead end facing the gap.

11. The electrical apparatus of claim 4, wherein the case includes an upper case and a lower case assembled with the upper case.

12. The electrical apparatus of claim 5, wherein the gap is disposed between one of the first side walls and the case.

13. The electrical apparatus of claim 1, wherein the entrapping structure extends above the first upper wall.

14. The electrical apparatus of claim 13, wherein the second side wall and the rear wall extend above the first upper wall.

15. The electrical apparatus of claim 14, wherein the mating sleeve has a flange extending from the one of the first side walls through the first upper wall.

16. The electrical apparatus of claim 15, wherein the second side wall and the rear wall comprise portions of the flange.

17. The electrical apparatus of claim 1, wherein the second lower wall protrudes outward from an intermediate position along a length of the one of the first side walls such that the entrapping structure extends only partially along the length of the first side wall in the vertical direction.

18. The electrical apparatus of claim 1, wherein the entrapping structure is formed integrally with the mating sleeve.

19. An electrical apparatus, comprising:
- an electrical connector having a plurality of terminals and a connector housing retaining the terminals, the connector housing including a mating sleeve with a first upper wall and a first lower wall disposed at a predetermined distance from each other, and a pair of first side walls connecting the first upper wall and the first lower wall;
- a case containing the electrical connector;
- a first entrapping structure corresponding to at least a portion of a gap between the connector housing and the case, the first entrapping structure having:
  - a second lower wall protruding outward in a width direction from one of the first side walls,
  - a second side wall extending in a vertical direction from the second lower wall,
  - a rear wall connecting the second lower wall and the second side wall, and
  - a first dead end with an opening facing the gap and defined between the second lower wall, the second side wall, the rear wall, and the one of the first side walls; and
- a second entrapping structure defined by the mating sleeve and disposed below the first entrapping structure.

20. An electrical apparatus, comprising:
- an electrical connector having a plurality of terminals and a connector housing retaining the terminals, the connector housing including a mating sleeve with a first upper wall and a first lower wall disposed at a predetermined distance in a height direction of the connector housing, and a pair of first side walls connecting the first upper wall and the first lower wall;
- a case containing the electrical connector;
- a circuit board electrically connected with the terminals; and
- an entrapping structure corresponding to at least a portion of a gap between the connector housing and the case, the entrapping structure including:
  - a second lower wall protruding outward in a width direction of the connector housing from one of the first side walls;
  - a second side wall extending from an outer end of the second lower wall in a vertical direction;
  - a rear wall connecting a rear end of the second lower wall and a rear end of the second side wall; and
  - a dead end with an opening facing the gap.

* * * * *